United States Patent
Imai et al.

(10) Patent No.: US 9,308,715 B2
(45) Date of Patent: Apr. 12, 2016

(54) LAMINATE AND METHOD FOR SEPARATING THE SAME

(71) Applicant: Tokyo Ohka Kogyo Co., Ltd., Kawasaki-shi (JP)

(72) Inventors: Hirofumi Imai, Kawasaki (JP); Koki Tamura, Kawasaki (JP); Atsushi Kubo, Kawasaki (JP); Takahiro Yoshioka, Kawasaki (JP); Yasushi Fujii, Kawasaki (JP); Yoshihiro Inao, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 0 days.

(21) Appl. No.: 14/183,988

(22) Filed: Feb. 19, 2014

(65) Prior Publication Data

US 2014/0166209 A1  Jun. 19, 2014

Related U.S. Application Data

(62) Division of application No. 13/290,412, filed on Nov. 7, 2011, now abandoned.

(30) Foreign Application Priority Data

Nov. 15, 2010 (JP) ................................. 2010-255349
Oct. 18, 2011 (JP) ................................. 2011-229212

(51) Int. Cl.
*B32B 38/10* (2006.01)
*B32B 43/00* (2006.01)
(Continued)

(52) U.S. Cl.
CPC ............... *B32B 43/006* (2013.01); *B32B 38/10* (2013.01); *H01L 21/6835* (2013.01);
(Continued)

(58) Field of Classification Search
CPC  B32B 38/10; B32B 43/006; Y10T 156/1917; Y10T 156/1158
See application file for complete search history.

(56) References Cited

U.S. PATENT DOCUMENTS 4,909,806 A   3/1990 Garbe
5,098,501 A * 3/1992 Nishiguchi ....... H01L 21/67132
                                                        156/275.5

(Continued)

FOREIGN PATENT DOCUMENTS

EP       0 858 110 A1    8/1998
EP       1 351 308 A1    10/2003
(Continued)

OTHER PUBLICATIONS

International Search Report issued in International Patent Application No. PCT/JP2011/069173 on Nov. 22, 2011.
(Continued)

*Primary Examiner* — Mark A Osele
*Assistant Examiner* — Nickolas Harm
(74) *Attorney, Agent, or Firm* — Knobbe Martens Olson & Bear, LLP (57) ABSTRACT

A laminate including a supporter which transmits infrared; a substrate supported by the supporter; an adhesive layer via which the supporter and the substrate are attached to each other; and a separation layer positioned on a surface of the supporter to which surface the substrate is attached, and which is made of a compound having an infrared-absorbing structure. A target is tightly attached and supported in the laminate while securing easy separation of a supporter from the target.

3 Claims, 2 Drawing Sheets

(1) Irradiation with Infrared Laser    (2) Denaturization of Separation Layer    (3) Separation of Support Plate (51) Int. Cl.
*H01L 21/683* (2006.01)
*C08G 77/14* (2006.01)

(52) U.S. Cl.
CPC .... *B32B 2310/0825* (2013.01); *B32B 2457/14* (2013.01); *C08G 77/14* (2013.01); *H01L 2221/68318* (2013.01); *H01L 2221/68327* (2013.01); *H01L 2221/68381* (2013.01); *Y10T 156/1158* (2015.01); *Y10T 156/1195* (2015.01); *Y10T 428/31663* (2015.04)

(56) References Cited

U.S. PATENT DOCUMENTS

| | | | |
|---|---|---|---|
| 5,752,442 | A | 5/1998 | Johnson et al. |
| 6,881,765 | B2 | 4/2005 | Sasaki |
| 6,896,760 | B1 * | 5/2005 | Connell ............ H01L 21/6835 156/249 |
| 6,897,004 | B2 | 5/2005 | Uenishi et al. |
| 6,911,375 | B2 | 6/2005 | Guarini et al. |
| 6,930,023 | B2 | 8/2005 | Okada et al. |
| 7,108,955 | B2 | 9/2006 | Iwasawa et al. |
| 7,297,613 | B1 | 11/2007 | Mountain |
| 7,384,811 | B2 | 6/2008 | Miyamoto et al. |
| 7,462,551 | B2 | 12/2008 | Kulkarni et al. |
| 7,883,991 | B1 | 2/2011 | Wu et al. |
| 8,173,519 | B2 | 5/2012 | Morisue et al. |
| 2003/0019576 | A1 * | 1/2003 | Torres-Filho et al. ........ 156/344 |
| 2003/0024635 | A1 | 2/2003 | Utsunomiya et al. |
| 2004/0016504 | A1 | 1/2004 | Mitarai |
| 2004/0241934 | A1 | 12/2004 | Inoue |
| 2005/0130391 | A1 | 6/2005 | Takayama et al. |
| 2005/0233547 | A1 | 10/2005 | Noda et al. |
| 2006/0231527 | A1 | 10/2006 | Takayama et al. |
| 2008/0014532 | A1 | 1/2008 | Kessel et al. |
| 2009/0111279 | A1 * | 4/2009 | Sakashita .................... 438/761 |
| 2009/0115075 | A1 | 5/2009 | Kessel et al. |
| 2009/0133812 | A1 | 5/2009 | Noda et al. |
| 2009/0249604 | A1 | 10/2009 | Nakamura |
| 2010/0038035 | A1 | 2/2010 | Noda et al. |
| 2010/0041211 | A1 | 2/2010 | Noda et al. |
| 2010/0096080 | A1 | 4/2010 | Ohya et al. |
| 2010/0155936 | A1 | 6/2010 | Codding et al. |
| 2010/0273326 | A1 | 10/2010 | Nakamura et al. |
| 2011/0031620 | A1 | 2/2011 | Codding et al. |
| 2011/0067808 | A1 * | 3/2011 | Nishio et al. ................. 156/247 |
| 2011/0091811 | A1 | 4/2011 | Song et al. |
| 2011/0139375 | A1 * | 6/2011 | Yamamoto et al. .......... 156/712 |
| 2011/0195248 | A1 | 8/2011 | Kiuchi et al. |
| 2011/0297771 | A1 | 12/2011 | Noda et al. |
| 2014/0151328 | A1 | 6/2014 | Miyanari et al. |
| 2014/0255638 | A1 | 9/2014 | Imai et al. |
| 2014/0332149 | A1 | 11/2014 | Fujii et al. |
| 2015/0010724 | A1 | 1/2015 | Ogata et al. |

FOREIGN PATENT DOCUMENTS

| | | |
|---|---|---|
| EP | 1 655 633 A2 | 5/2006 |
| EP | 1 744 365 A2 | 1/2007 |
| EP | 1 758 169 A2 | 2/2007 |
| JP | 07-256812 A | 10/1995 |
| JP | A-10-125929 | 5/1998 |
| JP | A-2002-217390 | 8/2002 |
| JP | A-2002-226796 | 8/2002 |
| JP | 2004-064040 | 2/2004 |
| JP | A-2004-238464 | 8/2004 |
| JP | A-2005-183689 | 7/2005 |
| JP | A-2005-197673 | 7/2005 |
| JP | 2005-302982 A | 10/2005 |
| JP | A-2007-188967 | 7/2007 |
| JP | 2007-258663 A | 10/2007 |
| JP | 2008-041987 A | 2/2008 |
| JP | A-2008-166578 | 7/2008 |
| JP | 2009-263316 | 11/2009 |
| JP | 2009-263596 | 11/2009 |
| JP | 2010-098072 | 4/2010 |
| JP | 2010-100686 A | 5/2010 |
| JP | 2010-120901 A | 6/2010 |
| JP | 2010-153812 | 7/2010 |
| JP | 2010-165802 | 7/2010 |
| KR | 20080071139 A | 8/2008 |
| KR | 20090031562 | 3/2009 |
| TW | 200507069 | 2/2005 |
| WO | 2008/146438 A1 | 12/2008 |

OTHER PUBLICATIONS

International Search Report issued in International Patent Application No. PCT/JP2011/073245 on Dec. 27, 2011.
Office Action issued in U.S. Appl. No. 13/290,412 on Nov. 21, 2013.
Silverstein et al., "Spectrometric Identification of Organic Compounds," Yuukikagoubutsu no supekutoru niyoru douteihou, Fifth Edition, -MS, IR, NMR, UV no heiyou-, pp. 146-151, 1992.
Office Action in U.S. Appl. No. 13/881,114 mailed Jan. 22, 2015.
Office Action for KR 10-2013-7012941, which corresponds to the co-pending U.S. Appl. No. 13/880,802 of present case.
Office Action of Corresponding JP application No. 2011-229212 dated Jun. 30, 2015.
Office Action for Taiwan Application No. 100141296 dated Jul. 22, 2015.
Office Action dated Oct. 8, 2015 of corresponding Taiwanese Patent Application No. 100138887—4 pages.
Final Office Action dated Aug. 3, 2015 of corresponding U.S. Appl. No. 13/881,114—8 pages.
Office Action dated Nov. 4, 2015 of corresponding Japanese Patent Application No. 2011-214817—2 pages.
Office Action issued in U.S. Appl. No. 13/881,114 on Jan. 11, 2016.

* cited by examiner

FIG. 1

LAMINATE AND METHOD FOR SEPARATING THE SAME

This application is a divisional of U.S. patent application Ser. No. 13/290,412, filed Nov. 7, 2011, which claims priority under 35 U.S.C. §119(a)-(d) to Japanese Patent Application No. 2010-255349, filed Nov. 15, 2010; and Japanese Patent Application No. 2011-229212, filed Oct. 18, 2011, the entire contents of which are hereby incorporated by reference.

TECHNICAL FIELD

The present invention relates to a laminate in which a supporter is temporarily attached to a product in production via a separation layer, and a method for separating the laminate.

BACKGROUND ART

Since mobile phones, digital AV devices, IC cards etc. are having more and more advanced functions, semiconductor silicon chips (hereinafter chips) mounted thereon are getting smaller and thinner. Consequently, there is an increasing demand for large-scale integration of silicon in a package. For example, integrated circuits in which a plurality of chips are one-packaged, such as CSP (Chip Size Package) and MCP (Multi-chip Package), are required to be thin. In order to realize large-scale integration of chips in a package, the thickness of a chip is required to be in a range of 25 to 150 μm.

However, a semiconductor wafer (hereinafter wafer) serving as a base of a chip gets thinner by polishing and decreases its strength, and consequently is more likely to be cracked or bended. Further, wafers with decreased strength due to thinning are difficult to be automatically transferred, and so require being manually transferred. Consequently, such wafers are difficult to handle.

In order to deal with this problem, there is developed a wafer handling system in which a plate called a support plate, made of glass or rigid plastic etc., is attached to a wafer to be polished, thereby reinforcing strength of the wafer and preventing cracks in the wafer and bend of the wafer. Since the wafer handling system reinforces strength of a wafer, a thinned wafer can be transferred automatically.

In the wafer handling system, a wafer and a support plate are attached to each other via various kinds of thermoplastic resin, adhesive etc. The wafer to which the support plate is attached is made thin and thereafter the support plate is separated from the wafer before the wafer is diced. For example, in order to make the wafer as thin as 150 μm or less, it is very preferable to tightly attach the wafer and the support plate to each other.

CITATION LIST

Patent Literatures

[Patent Literature 1]
Japanese Patent Application Publication, Tokukai No. 2004-064040 (published on Feb. 26, 2004)

SUMMARY OF INVENTION

Technical Problem

However, when the wafer and the support plate are tightly attached to each other, some bonding materials make it difficult to separate the support plate from the wafer without breaking the wafer. Tight adhesiveness is effective for making the wafer thinner, but results in breakage of the wafer with reduced strength when separating the support plate from the wafer. Further, when the support plate is separated from the wafer, a part of the support plate may remain on the surface of the wafer and around bumps, and in some cases, the bumps may be separated.

As described above, in order to make the wafer handling system automatic, it is required to develop a temporarily attaching technique of temporarily and tightly attaching a support plate to a wafer and at the same time securing smooth separation of the support plate from the wafer without breaking the wafer. Such a technique is very difficult to develop.

The present invention was made in view of the foregoing problem. An object of the present invention is to provide a laminate in which a supporter is tightly attached to a target in order to support the target while securing easy separation of the supporter from the target, and a method for separating the laminate.

Solution to Problem

In order to solve the foregoing problem, a laminate of the present invention includes: a supporter which transmits infrared; a substrate supported by the supporter; an adhesive layer via which the supporter and the substrate are attached to each other; and a separation layer, positioned on a surface of the supporter to which surface the substrate is attached, and made of a compound having an infrared-absorbing structure.

Advantageous Effects of Invention

With the arrangement, the present invention can provide a laminate in which a target is tightly attached and supported while securing easily separating a supporter from the target.

DESCRIPTION OF EMBODIMENTS

The following explains an embodiment of a laminate of the present invention.

A laminate of the present invention includes: a supporter which transmits infrared; a substrate supported by the supporter; an adhesive layer via which the supporter and the substrate are attached to each other; and a separation layer, positioned on a surface of the supporter to which surface the substrate is attached, and made of a compound with an infrared-absorbing structure.

The laminate of the present invention is not particularly limited in terms of its specific application, as long as the laminate is used as a laminate in which a substrate is temporarily attached to a supporter. The present embodiment will be explained using, as an example, a laminate in which a semiconductor wafer (substrate) is temporarily attached to a support plate (supporter) and which is used in a wafer support system.

(Separation Layer)

As described above, the laminate of the present invention includes a separation layer. The separation layer is made of a compound having an infrared-absorbing structure. The compound is denatured when absorbing infrared. As a result of the denaturization of the compound, the separation layer loses its strength or adhesiveness which has been owned before the separation layer is irradiated with infrared. Accordingly, adding only a slight external force (such as lifting the support plate) enables to break the separation layer so that the support plate can be easily separated from the semiconductor wafer.

Examples of the infrared-absorbing structure or the compound having the infrared-absorbing structure include: alkane, alkene (vinyl, trans, cis, vinyliden, trisubstituted, tetrasubstituted, conjugated, cumulene, cyclic), alkine (monosubstituted, disubstituted), monocyclic aromatic series (benzene, monosubstituted, disubstituted, trisubstituted), alcohols and phenols (free OH, intramolecular hydrogen bond, intermolecular hydrogen bond, secondary saturated, tertiary saturated, secondary unsaturated, and tertiary unsaturated), acetal, ketal, aliphatic ether, aromatic ether, vinylether, oxirane ring ether, peroxide ether, ketone, dialkylcarbonyl, aromatic carbonyl, enol of 1,3-diketone, hydroxyarylketone, dialkylaldehyde, aromatic aldehyde, carboxylic acid (dimer, carboxylate anion), formic ester, ester acetate, conjugated ester, non-conjugated ester, aromatic ester, lactone (β-, γ-, δ-), aliphatic acid chloride, aromatic acid chloride, acid anhydride (conjugated, non-conjugated, cyclic, non-cyclic), primary amide, secondary amide, lactam, primary amine (aliphatic, aromatic), secondary amine (aliphatic, aromatic), tertiary amine (aliphatic, aromatic), primary amine salt, secondary amine salt, tertiary amine salt, ammonium ion, aliphatic nitrile, aromatic nitrile, carbodiimide, aliphatic isonitrile, aromatic isonitrile, isocyanic ester, thiocyanic ester, aliphatic isothiocyanic ester, aromatic isothiocyanic ester, aliphatic nitro compound, aromatic nitro compound, nitroamine, nitrosamine, nitrate ester, nitrite ester, nitroso bond (aliphatic, aromatic, monomer, dimer), sulfur compound such as mercaptan, thiophenol, and thiol acid, thiocarbonyl group, sulfoxide, sulfone, sulfonyl chloride, primary sulfone amide, secondary sulfone amide, ester sulfate, carbon-halogen bond, Si-$A^1$ bond ($A^1$ is H, C, O or halogen), P-$A^2$ bond ($A^2$ is H, C, or O), and Ti—O bond.

Examples of the structure having the carbon-halogen bond include —CH$_2$Cl, —CH$_2$Br, —CH$_2$I, —CF$_2$—, —CF$_3$, —CH=CF$_2$, —CF=CF$_2$, aryl fluoride, and aryl chloride.

Examples of the structure having the Si-$A^1$ bond include SiH, SiH$_2$, SiH$_3$, Si—CH$_3$, Si—CH$_2$—, Si—C$_6$H$_5$, SiO aliphatic series, Si—OCH$_3$, Si—OCH$_2$CH$_3$, Si—OC$_6$H$_5$, Si—O—Si, Si—OH, SiF, SiF$_2$, and SiF$_3$. It is preferable that the structure having the Si-$A^1$ bond has a siloxane structure and a silsesquioxane structure in particular.

Examples of the structure having the P-$A^2$ bond include PH, PH$_2$, P—CH$_3$, P—CH$_2$—, P—C$_6$H$_5$, $A^3{}_3$-P—O ($A^3$ is aliphatic series or aromatic series), ($A^4$O)$_3$—P—O ($A^4$ is alkyl), P—OCH$_3$, P—OCH$_2$CH$_3$, P—OC$_6$H$_5$, P—O—P, P—OH, and O=P—OH.

The above structure can absorb infrared with a desired wavelength range when the kind of the structure is appropriately selected. For example, the above structure can absorb infrared with a wavelength in a range of 1 μm to 20 μm, to be more specific, in a range of 2 μm to 15 μm. In a case where the above structure is a Si—O bond, a Si—C bond, or a Ti—O bond, the structure can absorb infrared with a wavelength in a range of 9 μm to 11 μm. A person skilled in the art can easily understand what structure can absorb infrared with what wavelength range. For example, Non-patent Literature: "Yuukikagoubutsu no supekutoru niyoru douteihou (fifth edition)—MS, IR, NMR, UV no heiyou—" (published in 1992), pages 146-151 (the Japanese translation of "Spectrometric Identification of Organic Compounds" written by Silverstein, Bassler, and Morrill), describes what structure can absorb infrared with what wavelength range.

The compound having the infrared-absorbing structure used for the separation layer is not particularly limited as long as the compound has the above structure and is solvable in a solvent for the purpose of application and can be solidified to be a solid layer. It should be noted that in order to effectively denature the compound in the separation layer and facilitate separation of the support plate from the semiconductor wafer, it is preferable that the separation layer can absorb much amount of infrared, that is, transmittance of infrared when the separation layer is irradiated with the infrared is low. Specifically, transmittance of infrared in the separation layer is preferably lower than 90%, and more preferably lower than 80%. Further, by reducing transmitted light, it is possible to reduce the possibility of damage to a substrate due to the transmitted light.

Examples of the compound having a siloxane structure include resin which is a copolymer of a repeating unit represented by Formula (1) below and a repeating unit represented by Formula (2) below, and resin which is a copolymer of the repeating unit represented by Formula (1) below and a repeating unit derived from an acrylic compound.

In Formula (2), $R_1$ is a hydrogen atom, an alkyl group having not more than 10 carbon atoms, or an alkoxy group having not more than 10 carbon atoms.

Among them, the compound having a siloxane structure is more preferably a tert-butylstyrene (TBST)-dimethylsiloxane copolymer which is a copolymer of the repeating unit represented by Formula (1) and a repeating unit represented by Formula (3) below, and is further more preferably a TBST-dimethylsiloxane copolymer containing the repeating unit represented by Formula (1) and the repeating unit represented by Formula (3) below in a ratio of 1 to 1.

An example of the compound having a silsesquioxane structure is resin which is a copolymer of a repeating unit represented by Formula (4) below and a repeating unit represented by Formula (5) below.

(4)

(5)

In Formula (4), $R_2$ is a hydrogen atom or an alkyl group having 1-10 carbon atoms. In Formula (5), $R_3$ is an alkyl group having 1-10 carbon atoms or phenyl group.

In a case where the compound contains the repeating unit represented by Formula (4), it is easier to control the molecular amount in synthesis of resin, compared with a case of containing only the repeating unit represented by Formula (5). Further, in that case, the resulting resin is less likely to have cracks, thereby securing film stability.

Another examples of the compound having a silsesquioxane structure are silsesquioxane resins disclosed in Patent Literature 2: Japanese Patent Application Publication No. 2007-258663 (published on Oct. 4, 2007), Patent Literature 3: Japanese Patent Application Publication No. 2010-120901 (published on Jun. 3, 2010), Patent Literature 4: Japanese Patent Application Publication No. 2009-263316 (published on Nov. 12, 2009), and Patent Literature 5: Japanese Patent Application Publication No. 2009-263596 (published on Nov. 12, 2009).

Among them, the compound having a silsesquioxane structure is more preferably a copolymer of a repeating unit represented by Formula (6) below and a repeating unit represented by Formula (7) below or a copolymer of the repeating unit represented by Formula (6) and a repeating unit represented by Formula (8) below. The copolymer of the repeating unit represented by Formula (6) below and the repeating unit represented by Formula (7) below is further more preferably a copolymer containing the repeating unit represented by Formula (6) below and the repeating unit represented by Formula (7) below in a ratio of 7 to 3 (molar ratio). Further, the copolymer of the repeating unit represented by Formula (6) below and the repeating unit represented by Formula (8) below is a copolymer containing the repeating unit represented by Formula (6) below and the repeating unit represented by Formula (8) below further more preferably in a ratio of 7 to 3 through 5 to 5 (molar ratio), and particularly preferably in a ratio of 7 to 3 or 5 to 5 (molar ratio).

(6)

(7)

(8)

The polymer having a silsesquioxane structure may have any of a random structure, a ladder structure, and a basket structure.

Examples of the compound having a Ti—O bond include (i) alkoxy titanium such as tetra-i-propoxy titanium, tetra-n-butoxy titanium, tetrakis(2-ethylhexyloxy)titanium, and titanium-i-propoxyoctylene glycolate, (ii) chelate titanium such as di-i-propoxy bis(acetyl acetonate) titanium, and propanedioxytitanium bis(ethylacetoacetate), (iii) titanium polymers such as i-$C_3H_7O$—[—Ti(O-i-$C_3H_7)_2$—O-]$_n$-i-$C_3H_7$ and n-$C_4H_9O$—[—Ti(O-n-$C_4H_9)_2$—O-]$_n$-n-$C_4H_9$, (iv) titanium acylate such as tri-n-butoxytitanium monostearate, titanium stearate, di-i-propoxytitanium diisostearate, and (2-n-butoxycarbonyl benzoyloxy)tributoxytitanium, and (v) water-soluble titanium compound such as di-n-butoxy bis(triethanolaminato) titanium.

Among them, the compound having a Ti—O structure is preferably di-n-butoxy bis(triethanolaminato) titanium (Ti($OC_4H_9)_2[OC_2H_4N(C_2H_4OH)_2]_2$).

In a case where the compound having a siloxane structure and the compound having a silsesquioxane structure are copolymers of two or more kinds of repeating units, the content ratios of Si—O bond and Si—C bond in the copolymers can be changed by changing the ratios of the contained repeating units. Thus, it is possible to change the absorption ratio of infrared.

In the specification, "a compound is denatured" or "denaturization of a compound" indicates a phenomenon that a separation layer made of the compound is put in a state easily breakable by a slight external force, or a state with reduced adhesiveness to a component attached to the separation layer. Examples of the denaturization of a compound include (pyrogenetic or non-pyrogenetic) decomposition, changes in cross-linkage and molecular configuration, and dissociation of a functional group due to energy of absorbed infrared (and accompanying hardening, degasification, contraction or expansion of the separation layer). As described above, denaturization of a compound is caused due to absorption of infrared by the above structure. Accordingly, the kind of denaturization of a compound varies depending on the kind of the selected structure.

The separation layer is positioned on a surface of the support plate which surface is attached to the semiconductor wafer via the adhesive layer. That is, the separation layer is positioned between the support plate and the adhesive layer. This configuration enables preventing infrared emitted to the separation layer via the support plate from reaching the semiconductor wafer. Accordingly, in a case where a minute structure which requires protection is formed on a surface of the semiconductor wafer which surface is attached to the adhesive layer, the above configuration enables preventing the minute structure from being adversely influenced by irradiation with infrared.

The thickness of the separation layer may be in a range of 0.1 to 50 µm, and more preferably in a range of 0.1 to 10 µm. When the thickness of the separation layer is in a range of 0.1 to 50 µm, the separation layer can be denatured as required, by irradiation with infrared for a short time and irradiation with infrared having low energy.

The laminate of the present invention may be arranged such that other layer is further provided between the separation layer and the support plate. In this case, the other layer should be made of a material which transmits infrared. This configuration enables appropriately adding a layer which gives a desirable property to the laminate, without preventing infrared from being incident to the separation layer. The wavelength of infrared in use varies depending on the kind of the compound constituting the separation layer. Accordingly, the material for the other layer is not required to transmit all light, and may be appropriately selected from materials capable of transmitting infrared with a wavelength capable of denaturing the compound constituting the separation layer.

When the material for the adhesive layer is selected from materials having an infrared-absorbing structure, the adhesive layer and the separation layer can be formed in a single layer.

It is preferable that the separation layer is made of only a compound having an infrared-absorbing structure. However, the separation layer may contain an additional compound having no infrared-absorbing structure as long as the amount of the additional compound does not impair essential features of the present invention.

(Support Plate)

As described above, the support plate has infrared transparency. This is intended for enabling infrared externally emitted to the laminate to reach the separation layer via the support plate. Accordingly, the support plate is not necessarily required to transmit all kinds of infrared, but is only required to transmit infrared to be absorbed by the separation layer (i.e. infrared having a desired wavelength).

The support plate is for supporting the semiconductor wafer. Accordingly, the support plate should have a strength required for preventing breakage or deformation of the semiconductor wafer when the semiconductor wafer is processed and transferred.

In view of the above, an example of the support plate is a silicon plate. However, the support plate may be made of any material as long as the material can fulfill the above objects. When the support plate is a silicon plate, the support plate can transmit infrared with a wavelength of 2 µm or more.

In a case where the support plate in the laminate supports a Si device substrate such as a semiconductor wafer, use of Si for the support plate makes the support plate and the substrate have the same linear expansion coefficient. Accordingly, use of silicon for the support plate yields an excellent effect of decreasing deflection in process and accompanying distortion of the laminate.

Further, silicon has higher chemical resistance than glass. Accordingly, use of silicon for the support plate can improve chemical resistance of the laminate in processes such as a stress-relief process (process for flatting a polished surface by HF etc.) after the wafer is subjected to a thinning treatment.

Some semiconductor makers recycle silicon wafers. Therefore, use of silicon for the support plate enables such makers to recycle silicon wafers without requiring a new technique.

(Adhesive Layer)

The adhesive layer attaches and fixes the semiconductor wafer to the support plate and at the same time covers and protects the surface of the semiconductor wafer. Accordingly, the adhesive layer is required to have adhesiveness and strength sufficient for maintaining fixation of the semiconductor wafer to the support plate and covering of a surface of the semiconductor wafer to be protected, when the semiconductor wafer is processed or transferred. On the other hand, the adhesive layer is required to be easily separated or removed from the semiconductor wafer when fixation of the semiconductor wafer to the support plate is no longer required.

Therefore, the adhesive layer is made of an adhesive which normally has strong adhesiveness but reduces adhesiveness by a certain treatment or is soluble in a specific solvent. Various adhesives publicly known in the field to which the present invention pertains can be used as the adhesive constituting the adhesive layer of the present invention. The following explains the composition of resin contained in the adhesive layer in accordance with the present embodiment.

Resin contained in the adhesive layer should have adhesiveness. Examples of the resin include hydrocarbon resin, acryl-styrene-based resin, maleimide-based resin, and combinations thereof.

(Hydrocarbon Resin)

Hydrocarbon resin has a hydrocarbon structure and is obtained by polymerizing a monomeric compound. Examples of the hydrocarbon resin include, but not limited to, cycloolefin polymer (which may be hereinafter referred to as "resin (A)") and at least one kind of resin selected from the group consisting of terpene-based resin, rosin-based resin, and petroleum resin (which may be hereinafter referred to as "resin (B)").

The resin (A) may also be resin obtained by polymerizing monomeric components including cycloolefin monomers. Specific examples of the resin (A) include a ring-opening (co)polymer of monomeric components including cycloolefin monomers, and resin obtained by addition-co(polymerizing) monomeric components including cycloolefin monomers.

Examples of the cycloolefin monomer included in the monomeric components constituting the resin (A) include: bicyclic monomers such as norbornene and norbornadiene; tricyclic monomers such as dicyclopentadiene and dihydroxypentadiene; tetracyclic monomers such as tetracyclododecene; pentacyclic monomers such as cyclopentadiene trimer; heptacyclic monomers such as tetracyclopentadiene; alkyl substituents (such as methyl substituents, ethyl substituents, propyl substituents, and butyl substituents) of these polycyclic monomers; alkenyl substituents (such as vinyl substituents) of these polycyclic monomers; alkylidene substituents (such as ethylidene substituents) of these polycyclic monomers; and aryl substituents (such as phenyl substituents, tolyl substituents, and naphthyl substituents) of these polycyclic monomers. Among them, a norbornene monomer selected from the group consisting of norbornene, tetracyclododecene, and alkyl substituents thereof is preferable.

The monomeric components constituting the resin (A) may contain other monomer which is copolymerizable with the above cycloolefin monomer. It is preferable that the monomeric components include alkene monomer for example. Examples of the alkene monomer include ethylene, propylene, 1-butene, isobutene, 1-hexane, and α-olefin. The alkene monomer may be either straight-chained or branched.

In view of high-heat resistance (low pyrolytic property, small weight loss due to thermal deterioration), it is preferable that the monomeric components constituting the resin (A) include cycloolefin monomer. A ratio of cycloolefin monomer to the whole monomeric components constituting the resin (A) is preferably 5 mol % or greater, more preferably 10 mol % or greater, and further more preferably 20 mol % or greater. The ratio of cycloolefin monomer to the whole monomeric components constituting the resin (A) is not particularly limited, but in view of solubility and temporal stability in a solution, the ratio of cycloolefin monomer to the whole monomeric components constituting the resin (A) is preferably 80 mol % or less, and more preferably 70 mol % or less.

The monomeric components constituting the resin (A) may include straight-chained or branched alkene monomer. In view of solubility and flexibility, a ratio of alkene monomer to the whole monomeric components constituting the resin (A) is preferably 10-90 mol %, and more preferably 20-85%, and further more preferably 30-80 mol %.

In order to prevent gas from occurring at a high temperature, the resin (A) is preferably a resin without a polar group, such as a resin obtained by polymerizing monomeric components including cycloolefin monomer and alkene monomer.

A polymerization method and polymerization conditions for polymerizing monomeric components are not particularly limited, and may be appropriately set according to a usual technique.

Examples of commercially available products usable as the resin (A) include "TOPAS" (Polyplastics Co., Ltd.), "APEL" (Mitsui Chemicals, Inc.), "ZEONOR" and "ZEONEX" (ZEON CORPORATION), and "ARTON" (JSR Corporation).

Glass transition temperature (Tg) of the resin (A) is preferably 60° C. or greater, and particularly preferably 70° C. or greater. When the glass transition temperature of the resin (A) is 60° C. or greater, it is possible to further prevent the adhesive layer from being softened when the laminate is exposed to a high temperature environment.

The resin (B) is at least one selected from the group consisting of terpene-based resin, rosin-based resin, and petroleum resin. Specific examples of the terpene-based resin include terpene resin, terpenephenol resin, denatured terpene resin, hydrogenated terpene resin, and hydrogenated terpenephenol resin. Examples of the rosin-based resin include rosin, rosin ester, hydrogenated rosin, hydrogenated rosin ester, polymerized rosin, polymerized rosin ester, and denatured rosin. Examples of the petroleum resin include aliphatic petroleum resin or aromatic petroleum resin, hydrogenated petroleum resin, denatured petroleum resin, alicyclic petroleum resin, and coumarone-indene resin. Among them, hydrogenated terpene resin and hydrogenated petroleum resin are preferable.

The softening temperature of the resin (B) is not particularly limited, but preferably 80-160° C. When the softening temperature of the resin (B) is 80° C. or greater, it is possible to prevent the laminate from being softened when the laminate is exposed to a high temperature environment, thereby preventing deficient adhesion. When the softening temperature of the resin (B) is 160° C. or less, the laminate can be separated speedily.

Molecular mass of the resin (B) is not particularly limited, but is preferably 300-3000. When the molecular mass of the resin (B) is 300 or greater, the adhesive layer has sufficient heat resistance, so that the amount of degasification of the adhesive layer is small. When the molecular mass of the resin (B) is 3000 or less, the laminate can be separated speedily. The molecular mass of the resin (B) in the present embodiment means a molecular mass in terms of polystyrene standard measured by GPC (Gel Permeation Chromatography).

The resin may be a mixture of the resin (A) and the resin (B). By mixing the resin (A) and the resin (B), the adhesive layer has a better heat-resistance and the laminate can be separated more speedily. For example, a mixture ratio of the resin (A) to the resin (B) is preferably such that (A):(B)=80:20-55:45 (mass ratio) since this ratio allows the laminate to be separated speedily and allows the adhesive layer to have heat-resistance in a high temperature environment and to have flexibility.

(Acryl-Styrene Series Resin)

An example of the acryl-styrene-based resin is a resin obtained by polymerizing a monomer of styrene or styrene derivative and a monomer of (meth)acrylate ester etc.

Examples of (meth)acrylate ester include alkyl (meth)acrylate ester having a chain structure, (meth)acrylate ester having an aliphatic ring, and (meth)acylate ester having an aromatic ring. Examples of the alkyl (meth)acrylate ester having a chain structure include long-chain acrylic alkylester with an alkyl group having 15-20 carbon atoms and acrylic alkylester with an alkyl group having 1-14 carbon atoms. Examples of the long-chain acrylic alkylester include acrylic acid alkylester or methacrylic acid alkylester whose alkyl group is n-pentadecyl group, n-hexadecyl group, n-heptadecyl group, n-octadecyl group, n-nonadecyl group, n-eicosyl group etc. The alkyl group may be branched.

Examples of the acrylic alkylester with an alkyl group having 1-14 carbon atoms include publicly known acrylic alkylesters used in existing acrylic adhesives. Examples of such acrylic alkylesters include acrylic acid alkylester or methacrylic acid alkylester whose alkyl group is a methyl group, an ethyl group, a propyl group, a butyl group, a 2-ethylhexyl group, an isooctyl group, an isononyl group, an isodecyl group, a dodecyl group, a lauryl group, a tridecyl group or etc.

Examples of the (meth)acrylate ester having an aliphatic ring include cyclohexyl (meth)acrylate, cyclopentyl (meth)acrylate, 1-adamantly (meth)acrylate, norbornyl (meth)acrylate, isobornyl (meth)acrylate, tricyclodecanyl (meth)acrylate, tetracyclododecanyl (meth)acrylate, and dicyclopentanyl (meth)acrylate. Among them, isobornyl (meth)acrylate and dicyclopentanyl (meth)acrylate are more preferable.

The (meth)acylate ester having an aromatic ring is not particularly limited. Examples of the aromatic ring include a phenyl group, a benzyl group, a tolyl group, a xylyl group, a biphenyl group, a naphthyl group, an anthracenyl group, a phenoxymethyl group, and a phenoxyethyl group. The aromatic ring may have a chained or branched alkyl group having 1-5 carbon atoms. Specifically, phenoxyethyl acrylate is preferable.

(Maleimide-Based Resin)

The maleimide-based resin is a resin obtained by polymerizing monomers of, for example, a maleimide having an alkyl group such as N-methylmaleimide, N-ethylmaleimide, N-n-propylmaleimide, N-isopropylmaleimide, N-n-butylmaleimide, N-isobutylmaleimide, N-sec-butylmaleimide, N-tert-butylmaleimide, N-n-pentylmaleimide, N-n-hexylmaleimide, N-n-heptylmaleimide, N-n-octylmaleimide, N-laurylmaleimide, and N-stearylmaleimide; a maleimide having an aliphatic hydrocarbon group such as N-cyclopropylmaleimide, N-cyclobutylmaleimide, N-cyclopentylmaleimide, N-cyclohexylmaleimide, N-cycloheptylmaleimide, and N-cyclooctylmaleimide; and an aromatic maleimide having an aryl group such as N-phenylmaleimide, N-m-methylphenylmaleimide, N-o-methylphenylmaleimide, and N-p-methylphenylmaleimide.

The resin for the adhesive component may be, for example, cycloolefin copolymer which is a copolymer of a repeating unit represented by Formula (9) below and a repeating unit represented by Formula (10) below.

(9)

(10)

In Formula (10), n is an integer of 0 or 1-3.

Examples of such a cycloolefin copolymer include APL 8008T, APL 8009T, APL 6013T (each produced by Mitsui Chemicals, Inc.), "TOPAS" (Polyplastics Co., Ltd.), "ZEONOR" and "ZEONEX" (each produced by ZEON CORPORATION), and "ARTON" (JSR Corporation).

It is preferable that the adhesive layer is made of resin other than optical curing resin (e.g. UV curing resin). This is because there is a case where residues of the optical curing resin remain around minute concavities and convexities of a semiconductor wafer when an adhesive layer is separated or removed. It is particularly preferable that the adhesive layer is made of an adhesive which dissolves in a specific solvent. This is because the adhesive layer made of such an adhesive can be removed by dissolving the adhesive layer in the solvent without adding a physical strength to the semiconductor wafer. The adhesive layer made of such an adhesive can be removed from even a semiconductor layer with reduced strength without breaking or deforming the semiconductor wafer.

(Method for Producing Laminate)

Figure 1:
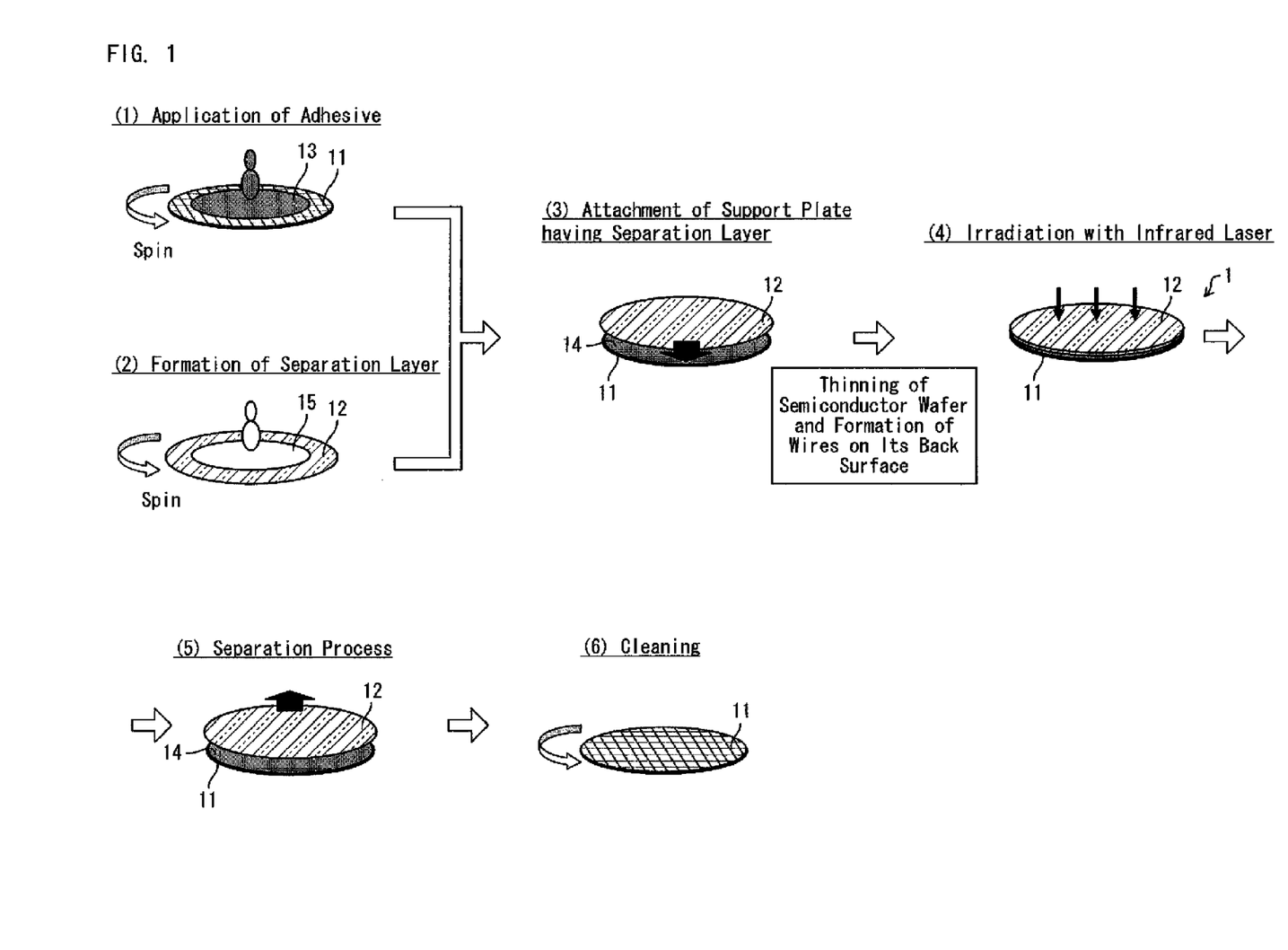
FIG. 1 is a drawing showing a method for producing a laminate and a method for separating a support plate, in accordance with the present embodiment.

The following explains a method of the present invention for producing a laminate with reference to FIG. 1. FIG. 1 is a drawing showing a method for producing a laminate and a process of separating a semiconductor wafer from the laminate.

As shown in FIG. 1, initially, an adhesive 13 is spin-applied to a surface of a semiconductor wafer 11 on which surface a desired element is provided ((1) Application of Adhesive in FIG. 1). The adhesive 13 is applied to the semiconductor wafer 11 in such a manner that the adhesive 13 is dissolved in a solvent. The semiconductor wafer 11 is stepwisely baked with increasing temperature, so that the adhesive 13 is hardened and an adhesive layer 14 is formed. On the other hand, a compound 15 having infrared-absorbing property, which is dissolved in a solvent, is spin-applied to one surface of a support plate 12 ((2) Formation of Separation Layer in FIG. 1). The solvent is evaporated so that the compound 15 is hardened and a separation layer 16 ("16" in FIG. 2) is formed.

Subsequently, the support plate 12 is attached to the semiconductor wafer 11 in such a manner that the adhesive layer 14 formed on one surface of the semiconductor wafer 11 contacts, at a surface thereof, the separation layer 16 formed on one surface of the support plate 12 ((3) Attachment of Support Plate having Separation Layer in FIG. 1). Attachment of the adhesive layer 14 to the separation layer 16 is made in such a manner that the adhesive layer 14 is caused to contact the separation layer 16 and they are pressurized in a vacuum at 200° C.

The laminate 1 of the present invention can be produced as described above. As for methods for producing the adhesive layer 14 and the separation layer 16 and a method for attaching the adhesive layer 14 to the separation layer 16, preferable methods may be appropriately selected from conventional and publicly known methods according to the state of the semiconductor wafer 11 (e.g. concavities and convexities of surface, strength etc.), the material for the adhesive layer 14, the material for the separation layer 16, the material for the support plate 12 etc.

The laminate 1 is subjected processing of the semiconductor wafer 11, irradiation with infrared, separation of the support plate 12, and removal of the adhesive layer 14, and consequently only the semiconductor wafer 11 remains. The following explains processes after the processing of the semiconductor wafer 11 to separation of the semiconductor wafer 11.

(Method for Separating Laminate)

Figure 2:
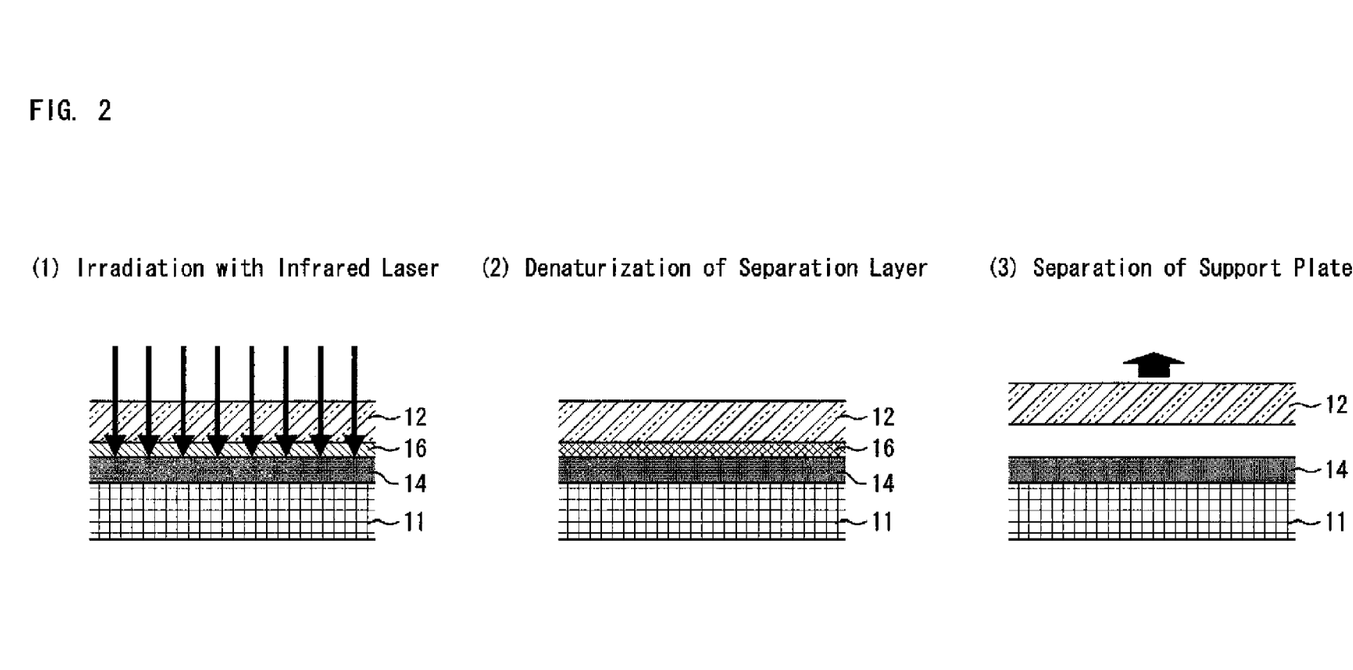
FIG. 2 is a drawing showing in detail a process of separating a support plate.

The following explains a method of the present invention for separating a laminate with reference to FIGS. 1 and 2. FIG. 2 is a cross sectional drawing showing a process of separating a semiconductor wafer from a laminate.

As shown in FIG. 1, after the semiconductor wafer 11 has been subjected to processes such as thinning of the semiconductor wafer 11 and formation of wires on a back surface of the semiconductor wafer 11, the laminate 1 is irradiated with infrared laser via a surface of the laminate 1 which surface is closer to the support plate 12 ((4) Irradiation with Infrared Laser in FIG. 1). When irradiated with infrared laser ((1) Irradiation with Infrared Laser in FIG. 2), the separation layer 16 is denatured ((2) Denaturization of Separation Layer in FIG. 2). Here, an explanation is made as to a case where the denaturization is decomposition of a compound contained in the separation layer 16.

Subsequently, the support plate 12 is separated from the semiconductor wafer 11 ((5) Separation Process in FIG. 1). The denatured separation layer 16 has remarkably reduced its strength. Accordingly, adding only a slight external force to lift the support plate enables to break the separation layer 16 easily so that the support plate 12 can be separated from the laminate 1 ((3) Separation of Support Plate in FIG. 2).

A solvent is sprayed to the adhesive layer 14 remaining on the semiconductor wafer 11 so that the adhesive layer 14 is removed ((6) Cleaning in FIG. 1). There is a case where residues of the separation layer 16 attach to the adhesive layer 14 after separation of the support plate 12. When the amount of the residues of the separation layer 16 is small, the solvent for dissolving the adhesive layer 14 is sprayed as described above. Further, before the spray, a solvent for dissolving the material for the separation layer 16 may be sprayed.

As described above, since the laminate of the present invention includes the separation layer, it is possible to easily separate the support plate from the semiconductor wafer when the laminate is irradiated with infrared.

It should be noted that all areas of the separation layer are not necessarily required to be irradiated with infrared. Even in a case where an infrared-irradiated area and a non-infrared-irradiated area coexist, when the strength of the separation layer 16 as a whole has been sufficiently reduced, adding only a slight external force to lift the support plate enables to break the separation layer 16 easily so that the support plate 12 can be separated from the laminate 1. Although a ratio of an area to be irradiated with infrared to an area not to be irradiated with infrared and a positional relationship between the areas vary depending on the kind of a compound constituting the separation layer, the thickness of the separation layer, the intensity of infrared with which the area is to be irradiated etc., a person skilled in the art can appropriately set conditions without undue experimentation. For example, in later-mentioned Examples, an area not irradiated with infrared was positioned adjacently to an area irradiated with infrared in such a manner that the area not irradiated with infrared had the same width as a marking width of infrared.

As described above, even in a case where only a part of the separation layer is irradiated with infrared, it is possible to separate the support plate. This enables to shorten a whole time for emitting infrared per one laminate, thereby shortening a time for the separation process.

The following explains an embodiment of the present invention in more detail by describing Examples. It should be noted that the present invention is not limited to Examples below and may encompass variations in its details. Further, it should be noted that the present invention is not limited to the above, embodiment, and may encompass many variations within the scope of the claims, and an embodiment based on a proper combination of technical means disclosed in different embodiments is encompassed in the technical scope of the present invention. Further, all the literatures cited in the specification are incorporated herein by reference.

EXAMPLES

Preparation of Laminate

A laminate in Example 1 was prepared as follows. A tert-butylstyrene (TBST)-dimethylsiloxane copolymer having a siloxane structure, which is a copolymer of a repeating unit represented by Formula (3) below and a repeating unit represented by Formula (1) below (this copolymer is hereinafter referred to as Resin 1), was dissolved in PGMEA in such a manner that the content of the Resin 1 after dissolution was 20 weight %. Thus, a separation layer solution was obtained. An abundance ratio (molar ratio) of the repeating units in the Resin 1 was such that Formula (3): Formula (1)=1:1. Weight-average molecular weight Mw of the Resin 1 was 8,000.

The separation layer solution was spin-applied onto a silicon wafer serving as a support plate in such a manner that the separation layer would have a thickness of 1 μm after baking the silicon wafer. Subsequently, the silicon wafer was stepwisely heated for 1 min at 100° C., 160° C. and 220° C. so that the solvent was evaporated. Thus, a support plate having a separation layer with a thickness of 1 μm was obtained.

On the other hand, APL 8008T (Mitsui Chemicals, Inc.) which is a cycloolefin polymer (hereinafter referred to as COC1) was dissolved in p-menthane in such a manner that the content of COC1 after dissolution would be 25 weight %. Thus, an adhesive composition was obtained. The adhesive composition was spin-applied onto a semiconductor wafer in such a manner that the adhesive composition would have a thickness of 100 μm after baking the semiconductor wafer. Subsequently, the semiconductor wafer was stepwisely baked for 5 min at 100° C., 160° C. and 220° C. so that an adhesive layer with a thickness of 100 μm was formed on the semiconductor wafer.

Subsequently, the support plate having the separation layer and the semiconductor wafer were caused to face each other in such a manner that the separation layer and the adhesive layer contact each other at their surfaces, and the separation layer and the semiconductor wafer were caused to attach to each other at 200° C. Thus, a laminate was prepared.

Further, laminates in Examples 2-14 were prepared similarly with the laminate in Example 1 except for the following points.

In a case of the laminate in Example 2, the Resin 1 was dissolved in PGMEA in such a manner that the content of the Resin 1 after dissolution would be 40 weight % to obtain a separation layer solution. A separation layer was formed from the separation layer solution.

In a case of the laminate in Example 3, an adhesive layer was formed to have a thickness of 10 μm.

The laminate in Example 4 was the same as the laminate in Example 1.

In cases of the laminates in Examples 5 and 6, TOS-174ME (Toray Fine Chemicals Co., Ltd.) which is a copolymer of a repeating unit represented by Formula (6) below and a repeating unit represented by Formula (7) below (this copolymer is hereinafter referred to as Resin 2) was dissolved in PGMEA in such a manner that the content of the Resin 2 after dissolution would be 20 weight %. Thus, a separation layer solution was obtained. A separation layer was formed from the separation layer solution. An abundance ratio (molar ratio) of the repeating units in the Resin 2 was such that Formula (6):Formula (7)=70:30. Weight-average molecular weight Mw of the Resin 2 was 6,500.

(6)

(7)

(8)

In cases of the laminates in Examples 7 and 8, di-n-butoxy bis(triethanolaminato)titanium (hereinafter referred to as TAT) was dissolved in n-BuOH in such a manner that the content of TAT after dissolution would be 20 weight %. Thus, a separation layer solution was obtained, and a separation layer was formed from the separation layer solution.

In cases of the laminates in Examples 9 and 10, resin having a silsesquioxane structure, which is a copolymer of the repeating unit represented by Formula (6) above and a repeating unit represented by Formula (8) below, was dissolved in PGMEA in such a manner that the content of the resin after dissolution would be 20 weight %. Thus, a separation layer solution was obtained, and a separation layer was formed from the separation layer solution. An abundance ratio (molar ratio) of the repeating units in the resin in the present Example was such that Formula (6):Formula (8)=70:30. This resin is hereinafter referred to as Resin 3.

In cases of the laminates in Examples 11 and 12, resin having a silsesquioxane structure, which is a copolymer of the repeating unit represented by Formula (6) above and the repeating unit represented by Formula (8) above was dissolved in PGMEA in such a manner that the content of the resin after dissolution would be 20 weight %. Thus, a separation layer solution was obtained, and a separation layer was formed from the separation layer solution. An abundance ratio (molar ratio) of the repeating units in the resin in the present Example was such that Formula (6):Formula (8)=50:50. This resin is hereinafter referred to as Resin 4.

In cases of the laminates in Examples 13 and 14, the Resin 4 and silica filler were dissolved in PGMEA in such a manner that each of the contents of the Resin 4 and the silica filler would be 20 weight %. Thus, a separation layer solution was obtained, and a separation layer was formed from the separation layer solution.

Further, laminates in Comparative Examples 1 and 2 were prepared similarly with the laminate in Example 1 except for the following points.

The laminate in Comparative Example 1 was a laminate prepared by attaching a support plate made of a silicon wafer on which a separation layer is not formed to a semiconductor wafer via an adhesive layer.

In a case of the laminate in Comparative Example 2, acrylic polymer which is a copolymer of repeating units represented by Formulae (11)-(13) below (hereinafter referred to as Resin 5) was dissolved in PGMEA in such a manner that the content of the Resin 5 after dissolution would be 20 weight %. Thus, a separation layer solution was obtained, and a separation layer was formed from the separation layer solution. An abundance ratio (molar ratio) of the repeating units in the Resin 5 was such that Formula (11): Formula (12): Formula (13)=50: 18:32. Weight-average molecular weight Mw of the Resin 5 was 80,000.

(11)

(12)

(13)

[Evaluation of Separation Layer]
(Measurement of Transmittance of Infrared)

Transmittances of infrared in the separation layers of the laminates in Examples 1-14 and of the laminate in Comparative Example 2, respectively, were measured as follows.

With respect to support plates made of silicon plates on which separation layers were formed, transmittances of infrared (10.0 μm) in the separation layers were measured with Nicolet 6700 FT-IR (Thermo Fisher Scientific, K.K.).

(Evaluation of Separation Property)

The laminates in the Examples and Comparative Examples were subjected to processes below and then evaluated in terms of whether the support plates could be separated from the semiconductor wafer or not.

The semiconductor wafers in the laminates obtained as above were thinned and subjected to a photolithography process and a back-surface wiring process, and then infrared laser with a wavelength of 10.6 µm (Examples 1-3, 5, 7) or a wavelength of 9.3 µm (Examples 4, 6, 8-14) was emitted to the separation layers via surfaces of the laminates which surfaces were closer to the support plates. Specifically, emission was made using a laser marker ML-Z9520 (KEYENCE CORPORATION) under conditions that the wavelength was 9.3 µm, the output was 60 or 80%, the pulse was 25 kHz, the marking speed was 2,000 mm/s, the line width (spot diameter) was 160 µm, and the marking pitch was 320 µm or using a laser marker ML-Z9520T (KEYENCE CORPORATION) under conditions that the wavelength was 10.6 µm, the output was 60 or 80%, the pulse was 25 kHz, the marking speed was 3,000 mm/s, the line width (spot diameter) was 200 µm, and the marking pitch was 400 µm. In both cases, the marking pitch was set to be twice of the marked line width. Consequently, in each separation layer, a marked area (irradiated area) and a non-marked area (non-irradiated area) each having the same width were formed successively.

The laminates having been irradiated with laser were placed with their support plates facing upward, and the support plates were lifted. A laminate whose support plate was separated merely by lifting the support plate was evaluated as "good", and a laminate whose support plate was not separated merely by lifting the support plate was evaluated as "poor"

The composition of the laminate, transmittance of infrared in the separation layer, the wavelength of emitted infrared laser, and evaluation on the separation property of the laminate after irradiation with infrared laser are described in Tables 1 and 2 below.

with infrared laser. Consequently, by merely lifting the support plates, the support plates were easily separated from the semiconductor wafers. In contrast thereto, the separation layer of the laminate in Comparative Example 2 was not denatured by irradiation with infrared laser light, and the support plate was not separated from the semiconductor wafer. The laminate in Comparative Example 1 which did not include the separation layer was irradiated with infrared laser and then the support plate of the laminate was lifted, but the support plate was not separated.

Further, it was shown that the composition constituting the separation layer had a wide infrared absorption range, so that the composition could deal with infrareds with different wavelengths. Further, it was shown that even when the separation layer had a large thickness (Example 2), the separation property of the support plate did not change.

Transmittance of infrared laser in the separation layer in each Example was less than 80%. Transmittance of infrared laser in the separation layer in Comparative Example 2 was 90% or greater. Transmittances of infrared laser in the separation layers in Examples 9-14 were less than 20%.

In each of the laminates in the Examples, the support plate was separated and then the adhesive layer was removed by spraying p-menthane. Thus, the semiconductor wafer was completely separated form the laminate without residues etc. on the semiconductor wafer.

As described above, the separation layers of the laminates in Examples 1-14 were made of a resin having a silsesquioxane structure or siloxane structure as a repeating unit, or made of a compound having an alkoxy titanium structure. Conse-

TABLE 1

|  |  | Ex. 1 | Ex. 2 | Ex. 3 | Ex. 4 | Ex. 5 | Ex. 6 | Ex. 7 | Ex. 8 |
|---|---|---|---|---|---|---|---|---|---|
| Material composition of separation layer (wt %) | Resin 1 | 20 | 40 | 20 | 20 | — | — | — | — |
|  | Resin 2 | — | — | — | — | 20 | 20 | — | — |
|  | TAT | — | — | — | — | — | — | 20 | 20 |
|  | PGMEA | 80 | 60 | 80 | 80 | 80 | 80 | — | — |
|  | n-BuOH | — | — | — | — | — | — | 80 | 80 |
| Thickness of separation layer (µm) |  | 1 | 10 | 1 | 1 | 1 | 1 | 1 | 1 |
| Transmittance of infrared (10 µm) through separation layer |  | <80% | <80% | <80% | <80% | <80% | <80% | <80% | <80% |
| Material composition of adhesive layer | COC1 | 25 | 25 | 25 | 25 | 25 | 25 | 25 | 25 |
|  | p-menthane | 75 | 75 | 75 | 75 | 75 | 75 | 75 | 75 |
| Thickness of adhesive layer (µm) |  | 100 | 100 | 10 | 100 | 100 | 100 | 100 | 100 |
| Wavelength of emitted infrared laser (µm) |  | 10.6 | 10.6 | 10.6 | 9.3 | 10.6 | 9.3 | 10.6 | 9.3 |
| Separation property |  | Good | Good | Good | Good | Good | Good | Good | Good |

TABLE 2

|  |  | Ex. 9 | Ex. 10 | Ex. 11 | Ex. 12 | Ex. 13 | Ex. 14 | Com. Ex. 1 | Com. Ex. 2 |
|---|---|---|---|---|---|---|---|---|---|
| Material composition of separation layer (wt %) | Resin 3 | 20 | 20 | — | — | — | — | — | — |
|  | Resin 4 | — | — | 20 | 20 | 20 | 20 | — | — |
|  | Resin 5 | — | — | — | — | — | — | — | 20 |
|  | Silica filler | — | — | — | — | 20 | 20 | — | — |
|  | PGMEA | 80 | 80 | 80 | 80 | 60 | 60 | — | 80 |
| Thickness of separation layer (µm) |  | 1 | 3 | 1 | 3 | 1 | 3 | — | 1 |
| Transmittance of infrared (10 µm) through separation layer |  | <20% | <10% | <10% | <5% | <5% | <1% | — | >90% |
| Material composition of adhesive layer | COC1 | 25 | 25 | 25 | 25 | 25 | 25 | 25 | 25 |
|  | p-menthane | 75 | 75 | 75 | 75 | 75 | 75 | 75 | 75 |
| Thickness of adhesive layer (µm) |  | 100 | 100 | 10 | 100 | 100 | 100 | 100 | 100 |
| Wavelength of emitted infrared laser (µm) |  | 9.3 | 9.3 | 9.3 | 9.3 | 9.3 | 9.3 | 10.6 | 10.6 |
| Separation property |  | Good | Good | Good | Good | Good | Good | Poor | Poor |

As shown in Tables 1 and 2, the separation layers of the laminates in Examples 1-14 were denatured by irradiation quently, the separation layers were denatured by irradiation with infrared laser, so that the support plates were very easily separated from the laminates. Further, the adhesive layers remaining on the semiconductor wafers were easily removed, so that there only remained the semiconductor wafers which no longer required to be supported by the support plates. In contrast thereto, in the laminate in each of the Comparative Examples, it was impossible to separate the support plate from the laminate in order that only a semiconductor wafer remained.

INDUSTRIAL APPLICABILITY

The present invention can provide a laminate in which layers are temporarily fixed and which is used in production of various products. In particular, the present invention can provide a laminate suitable for a process of temporarily fixing a semiconductor wafer or a chip to various kinds of supporters and treating the semiconductor wafer or the chip.

REFERENCE SIGNS LIST

1. Laminate
11. Semiconductor wafer (substrate)
12. Support plate (supporter)
13. Adhesive
14. Adhesive layer
15. Composition
16. Separation layer

What is claimed is:

1. A method for separating a support plate from a substrate, the method including:
   providing a laminate including a substrate having a major surface, a support plate transmissive to an infrared light, an adhesive layer interposed between the support plate and the substrate, and a separation layer interposed between the support plate and the adhesive layer, wherein the separation layer comprises an infrared absorbent compound and includes a first portion and a second portion adjacent to the first portion when viewed from a direction perpendicular to the major surface, wherein the adhesive layer does not comprise an optical curing resin,
   selectively emitting an infrared light beam to the first portion of the separation layer via the support plate while not emitting the infrared light to the second portion of the separation layer, such that the first portion of the separation layer is denatured as the infrared absorbent compound absorbs the infrared light beam and that the second portion remains undenatured and
   subsequently, while the second portion of the separation layer remains undenatured after infrared light emission, exerting an external force to the laminate to separate the support plate from the substrate.

2. The method of claim 1, wherein the laminate is such that a semiconductor wafer as the substrate is temporarily attached to the support plate in order to reinforce strength of the substrate, and
   the method is used to separate the semiconductor wafer from the support plate.

3. The method of claim 1, wherein energy of the infrared light beam is absorbed in the infrared absorbent compound to cause decomposition of the infrared absorbent compound, so that the substrate is removable from the support plate.

* * * * *